United States Patent
Kowalevicz et al.

(10) Patent No.: US 9,165,963 B2
(45) Date of Patent: Oct. 20, 2015

(54) NON-RETRO-REFLECTIVE IMAGING USING TILTED IMAGE PLANES

(71) Applicant: Raytheon Company, Waltham, MA (US)

(72) Inventors: Andrew M. Kowalevicz, Arlington, VA (US); Frank Allen Birdsong, Jr., Alexandria, VA (US)

(73) Assignee: RAYTHEON COMPANY, Waltham, MA (US)

(*) Notice: Subject to any disclaimer, the term of this patent is extended or adjusted under 35 U.S.C. 154(b) by 220 days.

(21) Appl. No.: 13/951,748

(22) Filed: Jul. 26, 2013

(65) Prior Publication Data

US 2015/0028188 A1    Jan. 29, 2015

(51) Int. Cl.
    *H01L 27/146*    (2006.01)
(52) U.S. Cl.
    CPC .................. *H01L 27/14625* (2013.01)
(58) Field of Classification Search
    CPC ... G02B 23/12; G02B 13/16; H01L 27/14625
    See application file for complete search history.

(56) References Cited

U.S. PATENT DOCUMENTS

| | | | |
|---|---|---|---|
| 5,629,492 A | 5/1997 | Gleason | |
| 6,862,147 B1 | 3/2005 | Sonstroem | |
| 6,974,219 B1 | 12/2005 | Geneczko et al. | |
| 7,282,695 B2 | 10/2007 | Weber et al. | |
| 7,576,791 B2 | 8/2009 | Sonstroem | |
| 8,835,825 B2 * | 9/2014 | Barkan et al. | 250/208.1 |
| 2010/0283848 A1 | 11/2010 | Adler et al. | |

OTHER PUBLICATIONS

Chevalier, William J., "Assessment of Glint Hazard to Soldiers", U.S. Army Soldier and Biological Command, Dec. 1998.
Fulghum, David A., "Sensor Versus Sensor in Combat", http://www.aviationweek.com/aw/blogs/defense/index.jsp?plckController=Blog&plckScript=blogScript&plckElementId=blogDest&plckBlogPage=BlogViewPost&plckPostId=Blog:27ec4a53-dcc8-42d0-bd3a-01329aef79a7Post:6b5204db-3e13-4728-a30e-5408ef711e6e Jan. 7, 2010.

* cited by examiner

*Primary Examiner* — Tony Ko
(74) *Attorney, Agent, or Firm* — Lando & Anastasi, LLP (57) ABSTRACT

A non-retro-reflective imaging system and methods in which tilted image plane imaging is combined with selective Fourier filtering to substantially eliminate retro-reflection from the system. In certain examples, tilted image plane imaging is achieved using sliced source imaging. Through rotation of the image plane, the majority of incident light is reflected off-axis, rather than being retro-reflected. The Fourier filter is used to block incoming light from a particular angle that would otherwise be normally incident on the rotated image plane and retro-reflected. One example of a non-retro-reflective imaging system includes an optical element that focuses electromagnetic radiation onto a tilted image plane, an imaging sensor co-aligned with the tilted image plane, and a Fourier filter positioned in a Fourier plane of the optical element, a position of the Fourier filter in the Fourier plane determined by the tilt angle of the tilted image plane.

18 Claims, 9 Drawing Sheets

NON-RETRO-REFLECTIVE IMAGING USING TILTED IMAGE PLANES

BACKGROUND

Figure 1:
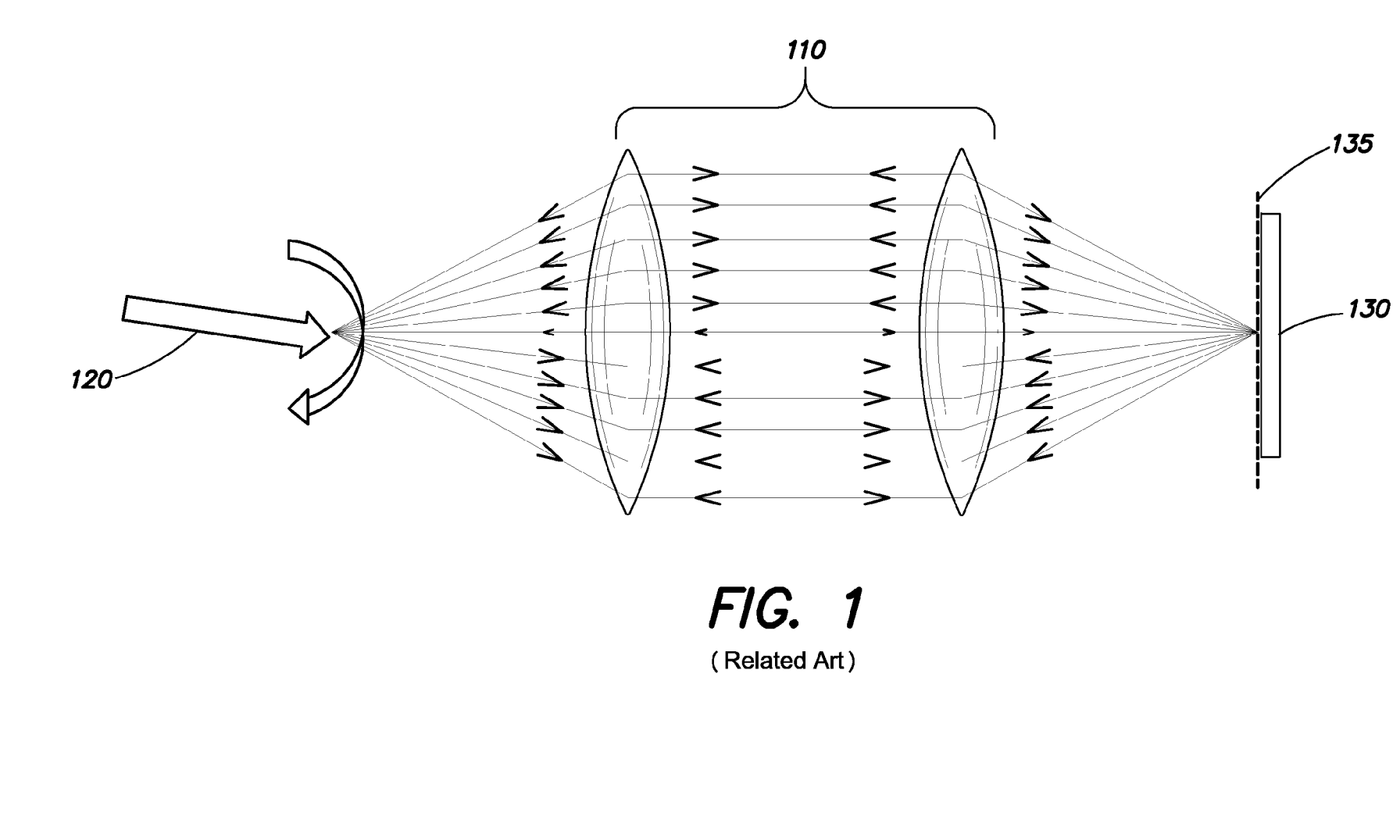
FIG. 1 is a diagram of one example of a conventional, retro-reflective imaging system.

Imaging and optical sensing devices are widely used in both commercial and military applications. Referring to FIG. 1, in traditional configurations of focused optical imaging or sensing systems, the optical system 110 focuses a representative point source of incoming light 120 onto a sensor array 130 located in the image plane 135 and oriented perpendicular to the optical axis of the system. This orientation is necessary to keep the image in focus across the entire active area of the sensor array 130; however this configuration makes the system retro-reflective. As a result, any light not absorbed by the sensor (e.g., a camera or focal plane array sensor) is reflected and imaged directly back to the source along the same optical path as the incident light (i.e., retro-reflected). Retro-reflection occurs for incoming light 120 at any angle within the acceptance angle of the optical system. Optical augmentation (OA) systems use this property of retro-reflection to detect hidden optical systems. For example, OA uses an active light source to sweep through an environment, illuminating any optical devices, and retro-reflection leads to the "cat's eye" effect, which allows illuminated optical systems to be identified, located and characterized. As may be seen with reference to FIG. 1, for a conventional, perpendicularly oriented sensor array 130, incoming optical augmentation beams at substantially any angle will be retro-reflected back to the source, allowing for easy detection of the optical system 110.

SUMMARY OF INVENTION

Aspects and embodiments are directed to imaging without retro-reflection. According to certain embodiments, an imaging system is configured to image using an image plane whose surface normal is tilted relative to the optical axis of the system, thereby avoiding retro-reflection, as discussed in more detail below. Additionally, Fourier optical filtering is used in combination with tilted-plane imaging techniques, to eliminate residual retro-reflection that may not have been accounted for by tilting the image plane, thereby providing a system that is fully non-retro-reflective. In certain embodiments, the imaging system is configured to image using a segmented image plane, also referred to as "sliced source" imaging, to achieve an in-focus image on the tilted image plane. As used herein the term source, in the context of sliced source imaging, may refer to an image of an object or the object itself. According to further embodiments, Fourier optical filtering may also be used to identify the location of an interrogating optical augmentation device, as discussed in more detail below.

According to one embodiment, a non-retro-reflective imaging system comprises at least one optical element configured to receive electromagnetic radiation and to focus the electromagnetic radiation onto a tilted image plane having a surface normal that is tilted relative to the optical axis of the imaging system, an imaging sensor co-aligned with the tilted image plane and configured to produce an image from the electromagnetic radiation, and a filter configured to block rays of the electromagnetic radiation that would be normally incident on the imaging sensor from reaching the image sensor.

In one example the tilted image plane has a surface normal that is tilted with an angle of rotation relative to the optical axis, and a position of the filter in the imaging system is determined based on the angle of rotation. In one example the filter is positioned in a Fourier plane of the at least one optical element. The non-retro-reflective imaging system may further comprise a controller configured to dynamically change the angle of rotation of the tilted image plane relative to the optical axis, and to correspondingly vertically move the filter in the Fourier plane. In one example the filter includes a linear detector array including a plurality of detector elements. In another example the filter is a passive beam block. In one example, the at least one optical element includes a relay optic configured to receive the electromagnetic radiation representing a source image volume and to reimage the source image volume onto the tilted image plane, and foreoptics configured to receive and focus the electromagnetic radiation to provide the source image volume to the relay optic, wherein the filter is positioned in a Fourier plane of the foreoptics. The relay optic may be a structured relay optic configured to slice the source image volume into a plurality of image slices, and to reimage the plurality of image slices onto the tilted image plane and spatially position the plurality of image slices such that the depth of focus of each image slice overlaps the tilted image plane. The structured relay optic may include an array of mirrors or an array of lenses, for example. In one example the foreoptics includes at least one lens.

According to another embodiment, a method of non-retro-reflective imaging in an optical imaging system comprises acts of receiving electromagnetic radiation representing a source image, focusing the electromagnetic radiation onto a tilted image plane having a surface normal that is tilted with an angle of rotation relative to the optical axis of the optical imaging system, producing a substantially in-focus image at the tilted image plane using an imaging sensor co-aligned with the tilted image plane, and selectively filtering rays of the electromagnetic radiation that would be normally incident on the tilted image plane to prevent the rays from reaching the tilted image plane.

In one example of the method selectively filtering the rays of the electromagnetic radiation includes positioning a Fourier filter at a location in a Fourier plane of the optical imaging system, the location being selected based on the angle of rotation. Positioning the Fourier filter may include positioning a passive beam block at the location on the Fourier plane, for example. In another example the Fourier filter includes a linear detector array, and the method further comprises detecting the rays of the electromagnetic radiation with the linear detector array. In one example the linear detector array includes a plurality of detector elements, and the method further comprises determining an azimuth angle of incidence of the rays of electromagnetic radiation based on detecting the rays with at least one of the plurality of detector elements. The method may further comprise dynamically varying the angle of rotation of the tilted image plane, and selectively filtering the rays of the electromagnetic radiation may include correspondingly moving the Fourier filter in the Fourier plane to accommodate the varying angle of rotation. In one example, the method further comprises segmenting the source image into a plurality of image slices, each image slice having an image volume, and individually reimaging the plurality of image slices onto the tilted image plane such that the image volume of each image slice overlaps the tilted image plane, wherein producing the substantially in-focus image at the tilted image plane includes reconstructing the substantially in-focus image from the plurality of image slices. In one example segmenting the source image and reimaging the plurality of image slices include focusing the plurality of image slices onto the tilted image plane using an array of lenses, each lens having a different focal length. In another example, segmenting the source image and reimaging the plurality of image slices include reflecting the plurality of image slices onto the tilted image plane using an array of mirrors.

According to another embodiment, a non-retro-reflective imaging system comprises at least one optical element configured to receive electromagnetic radiation and to focus the electromagnetic radiation onto a tilted image plane having a surface normal that is tilted with a tilt angle relative to the optical axis of the imaging system, an imaging sensor co-aligned with the tilted image plane and configured to produce an in-focus image from the electromagnetic radiation, and a Fourier filter positioned in a Fourier plane of the at least one optical element and configured to block rays of the electromagnetic radiation that would be normally incident on the imaging sensor from reaching the image sensor, a vertical position of the Fourier filter on the Fourier plane being determined by the tilt angle of the tilted image plane.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments are directed to an imaging system that eliminates the currently unavoidable (with conventional imaging systems) tell-tale retro-reflection from optical systems. In addition, according to certain aspects, the cost, weight and/or size of the imaging system may be reduced, while also improving the overall system capability, as discussed further below. According to one embodiment, a tilted imaging plane is used in combination with a Fourier optical filter to obtain a non-retro-reflective imaging system. As discussed in more detail below, according to certain embodiments, a structured relay optic may be configured to effectively "slice" or "segment" the source image, and re-image each of the slices individually onto a rotated image plane such that the entire image is faithfully reconstructed. In this manner, a segmented image plane is achieved, tilted or rotated in angle with respect to the optical axis of the optical system. The tilted image plane results in the optical system being substantially non-retro-reflective, while the segmentation of the image plane allows a substantially in-focus image to be maintained. This concept is referred to as sliced source imaging. Additionally, according to certain embodiments, the Fourier filter is used to eliminate residual retro-reflection not eliminated by tilting the image plane, as discussed in more detail below. Furthermore, by placing a non-retro-reflective detector in the Fourier plane, the angle of arrival of illumination in terms of relative azimuth angle and relative elevation angle may be determined, as discussed in more detail below.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 2A:
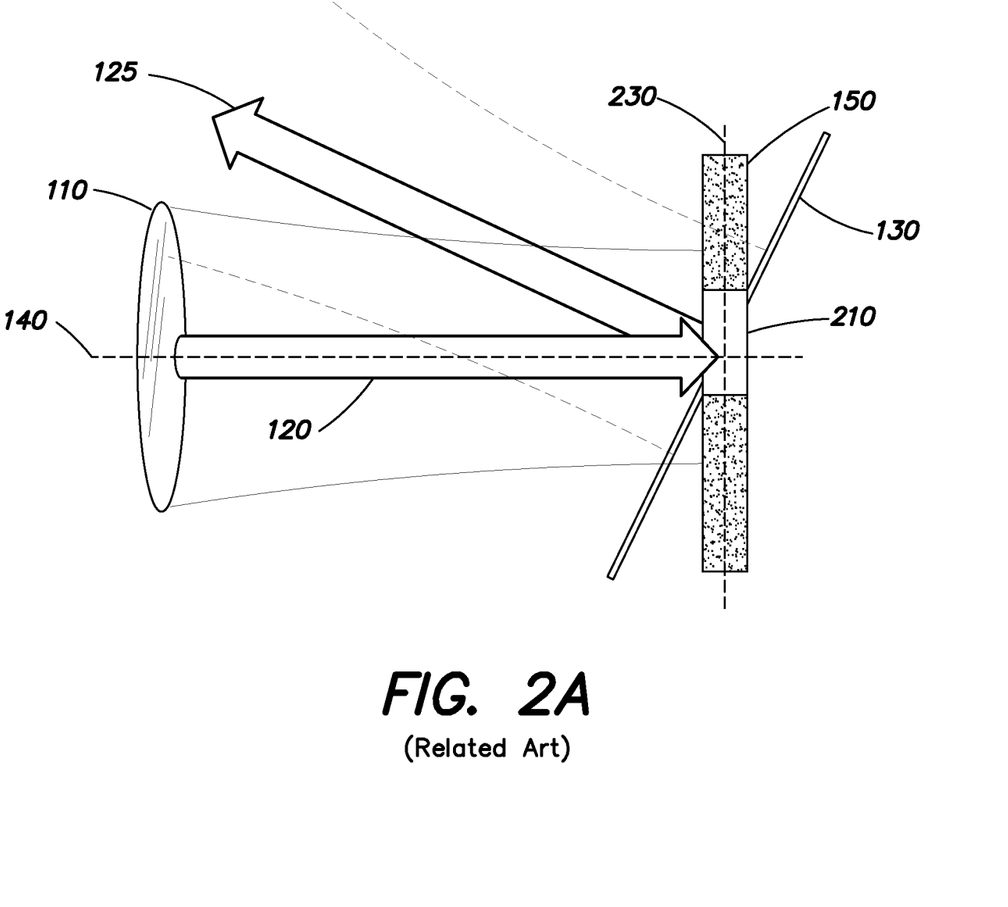
FIG. 2A is a diagram of an example of an imaging system that uses a tilted image plane to avoid retro-reflection.
Figure 2B:
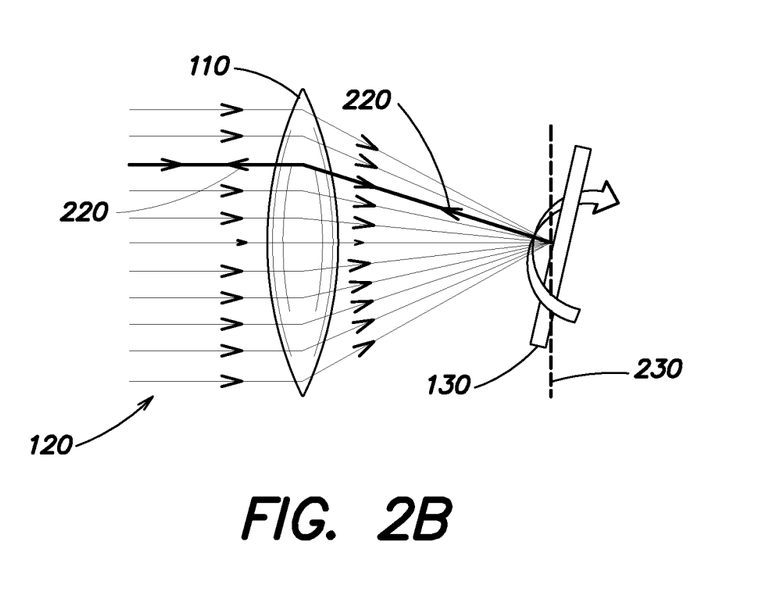
FIG. 2B is a diagram illustrating angle-specific retro-reflection from a tilted sensor array.

As discussed above, conventional focused imaging systems with perpendicularly oriented sensor arrays may provide good image formation; however, the retro-reflection makes these systems easily detectable by optical augmentation techniques. Retro-reflection may be somewhat avoided by tilting or rotating the focal plane array 130 relative to the optical axis 140, as illustrated in FIG. 2A. In the example illustrated in FIG. 2A, the surface normal of the focal plane array 130 is tilted by a few degrees with respect to the optical axis 140. Sufficient tilting will avoid retro-reflection for at least some incident light 120, as the reflected light 125 does not return to the optical system 110. Thus, the system is at least partially non-retro-reflective. However, merely tilting the focal plane array 130 without other modifications to the system is insufficient to produce a useful, non-retro-reflective imaging system for several reasons. First, due to the tilting and absent other modifications, only a small portion 210 of the image volume 150 (which is aligned with the normal 230 to the optical axis 140) overlaps the focal plane array 130, with the majority of the image volume having little or no overlap with the focal plane array 130, resulting in a blurry image. Thus, the image formation is poor due to the majority of the image being out of focus. Additionally, even though some light 125 is reflected off-axis due to the tilted focal plane array 130, certain rays 220 of the incident light 120 may enter and travel through the optical system 110 such that they strike the image sensor 130 perpendicular to its surface, as shown in FIG. 2B. These rays 220 will be retro-reflected.

Aspects and embodiments are directed to optical systems that include a tilted focal plane array to provide the benefit of substantially reduced retro-reflection, and are also configured to address both the residual retro-reflection and image formation issues associated with conventional tilted focal plane arrays. In particular, aspects and embodiments provide optical systems in which the image plane is tilted to coincide with the tilted focal plane array (or other imaging sensor), such that substantially the entire image volume overlaps the image plane, thereby producing an in-focus image while also reducing retro-reflections. According to one embodiment, a non-retro-reflective imaging system may be implemented by "slicing" the image volume and reconstructing the image from the slices, as discussed in more detail below. The image volume may be sliced by changing the position of the focus, such that each slice has a depth of focus that overlaps a region of a tilted image plane. As a result, an in-focus image may be reconstructed from a group of in-focus image slices, as discussed below.

Figure 3:
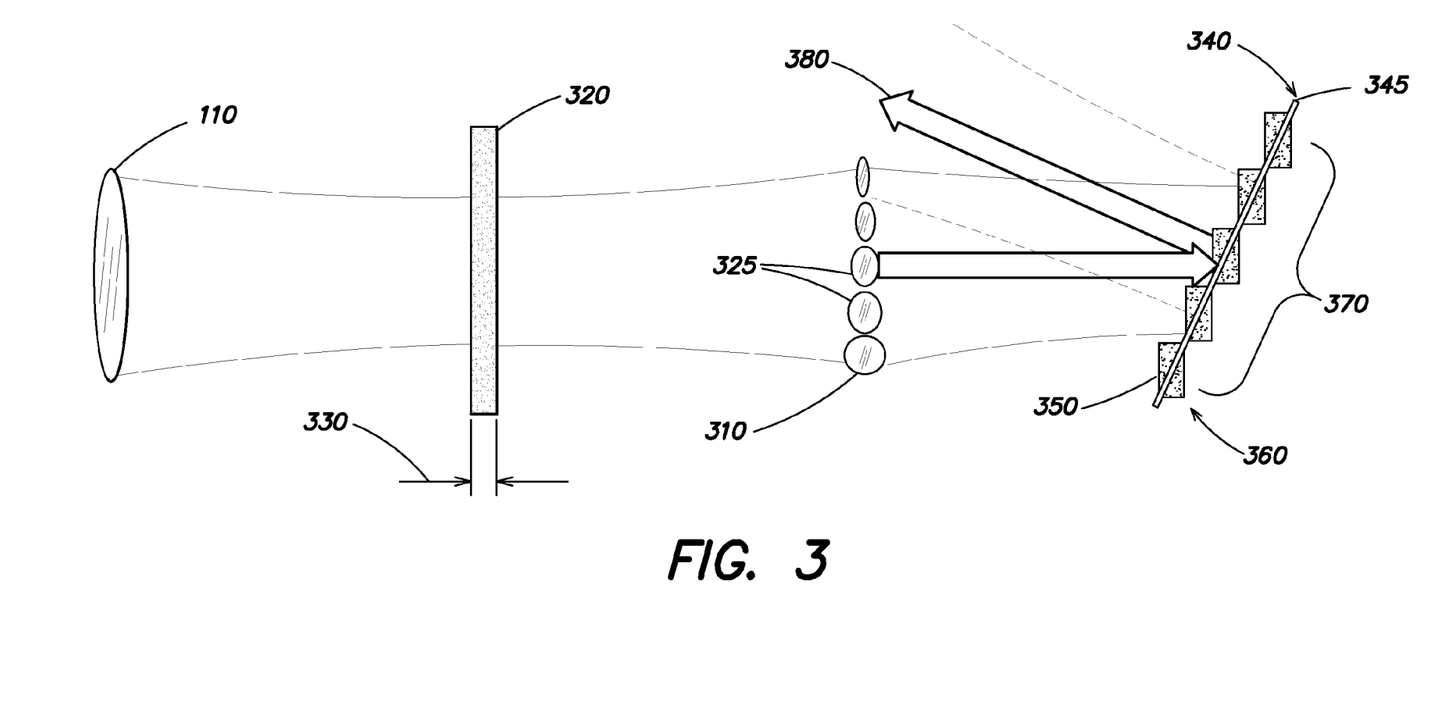
FIG. 3 is a diagram of one example of a non-retro-reflective sliced source optical imaging system according to aspects of the invention.

Referring to FIG. 3 there is illustrated a schematic representation of one example of an imaging system configured to implement sliced-source imaging according to one embodiment. An optical system, such as a lens or other foreoptics 110 may be used to focus incident light into the imaging system toward a relay optic 310. An image having an image volume 320 and depth of focus 330 is formed by the optical system 110 at a first image plane, and is reimaged by the relay optic 310 onto a second, tilted image plane 340. An imaging detector or sensor 345, such as a focal plane array (FPA), for example, is aligned with the tilted image plane 340. The relay optic 310 is configured to slice the image volume 320 into a plurality of slices 350 and reimage each slice individually onto the second image plane 340. In one example, the relay optic 310 is configured to reimage each slice at a slightly different focus position, such that the depth of focus 360 of each slice 350 overlaps the second image plane 340. In this manner, a substantially complete overlap 370 may be achieved between the tilted image plane 340 and the reconstructed image volume comprised of the plurality of slices 350. Thus, substantially the entire image may be in focus, and reflections 380 are generally off-axis with respect to the optic axis. As a result, excellent image formation may be achieved in a system that substantially reduces retro-reflection.

The relay optic 310 may be implemented using an array of lenses and/or or mirrors. In one example the relay optic 310 is segmented into sub-elements, each with the same reflecting angle, but with a uniform progression of delay distances relative to one another such that the image slices have different optical path lengths, as illustrated in FIG. 3. However, in other examples the reflecting angles may be different. In one example, the relay optic 310 is a lenslet array comprised of a plurality of lenslets 325 each having a different focal length.

Since each lenslet 325 has a different focal length, each lenslet forms an image portion (corresponding to a slice 350) at a slightly different distance from the relay optic 310. The focal lengths of the lenslets 325 may be selected such that the distances at which the image slices 350 are formed corresponds to the tilt of the image plane 340, and the depth of focus of each slice overlaps the sensor 345 positioned on the image plane, as illustrated in FIG. 3. In other examples, depending on the overall optical design, the focal length of the lenslets may be the same.

In addition, although the example illustrated in FIG. 3 uses a lenslet array to achieve the image slices 350, other optical elements may be used, such as a faceted or stepped mirror, an array of mirrors, or a deformable mirror, such as may be used for adaptive optics applications, for example. A deformable mirror may be controlled to alter the waveform, by altering the shape of the deformable mirror or selected portions thereof, to produce the group of image slices. As discussed above, the relay optic 310 may be implemented in numerous different ways and, regardless of physical implementation, functions to "slice" the source image and reimage each of the slices individually onto a rotated image plane such that a substantially in-focus reconstruction of the entire image is obtained, while substantially eliminating retro-reflection from the system.

As discussed above, if the depth of focus of each image slice 350 overlaps the rotated or tilted image sensor 345, then the resulting image remains in focus. There will be no retro-reflection from the system provided that the angle of tilt or rotation of the image plane 340 is sufficiently large, as discussed further below. In addition, to minimize loss of light, and therefore image resolution and/or the imaging range of the system, it may be desirable to segment the image plane 340 into as few slices as possible. The slice height may be determined based on the angle of incidence (corresponding to the tilt of the image plane 340) and the depth of focus of each slice, which in turn may be determined at least in part by the f/# (pronounced "f"—number) of the corresponding lenslet. The number of slices required to produce a substantially completely in-focus image may depend on the size of the image sensor 325 and the slice height.

Figure 4:
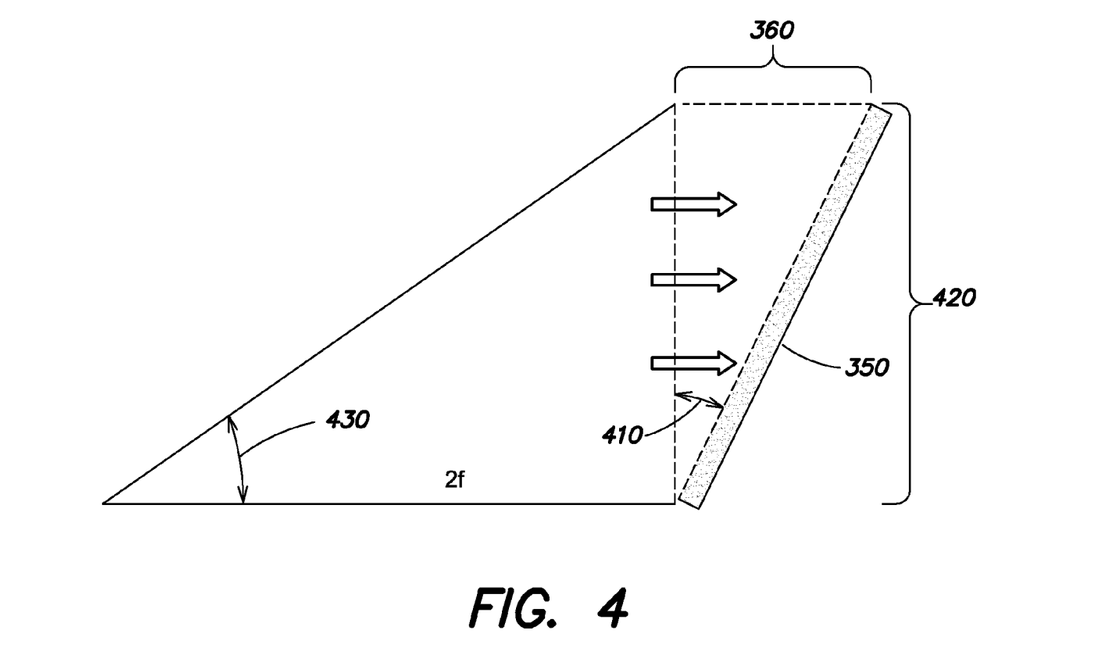
FIG. 4 is a diagram illustrating an example of the relationship between various parameters of a sliced source optical imaging system according to aspects of the invention.

FIG. 4 is a diagrammatic sketch illustrating, for one image slice 350, the relationship between the tilt angle 410 ($\theta$), the depth of focus 360, the slice height 420, and the angle of acceptance 430 (for one simulated system). No retro-reflection occurs when the tilt angle (TA) 410 exceeds the angle of acceptance 430. The maximum value of the tilt angle 410 is determined by the depth of focus 360 and the slice height 420. The depth of focus (DoF) 360 of each image slice 350 is given by:

$$DoF \approx 2Nc \approx \frac{f^2}{1000 \cdot D} \quad (1)$$

In Equation (1), N is the f/# of the lens corresponding to that image slice, c is the corresponding circle of confusion, f is the focal length of the lens, and D is the diameter of the lens. Thus, for a lens having a focal length of 25 millimeters (mm) and N=1, the depth of focus (DoF) is 50 microns ($\mu$m), for example. Table 1 below provides some examples of depth of focus for various examples of lenses with different characteristics (focal length, diameter and f/#). Those skilled in the art will appreciate that the shorter the focal length of the lens (for a given diameter), the greater the light gathering capacity of the system.

TABLE 1

| f (mm) | Diameter (mm) | f/# | DoF (μm) |
|---|---|---|---|
| 25 | 25 | 1 | 50 |
| 35 | 25 | 1.4 | 98 |
| 50 | 25 | 2 | 200 |
| 82.5 | 25 | 3.3 | 545 |
| 100 | 25 | 4 | 800 |

As discussed above, the depth of focus is the range of distance over which the image remains in focus, and therefore provides the "tolerance" on the location of the image sensor 345. Thus, large f/# systems may be accommodated with relatively few slices, each having a limited depth of focus. However, to accommodate lower f/# systems, more slices may be needed. Additionally, small tilt angles of the image plane may be accommodated with relatively few slices. However, a very small tilt angle may be insufficient to ensure that the system in fully non-retro-reflective. Larger tilt angles may be accommodated by either using more slices or slices having a larger depth of focus. As discussed further below, in some embodiments Fourier optical filtering is used in conjunction with the sliced source imaging approach to reduce the number of slices required for a given f/#, thus decreasing the light loss and significantly decreasing the system complexity. This combination approach may be particularly beneficial for lower f/# systems where, without selective filtering, the number of slices required may be too high for practical implementation.

As discussed above, in certain embodiments, a sliced or segmented image plane 340 may be achieved using a lenslet array, as illustrated in FIG. 3. In one example, the lenslet array may include a plurality of individual lenses that are positioned accurately with respect to one another to provide the array. For example, individual lenses may be coupled to a common array substrate. However, in other embodiments, machining techniques, such as diamond-turning techniques, may be used to produce a monolithic optical array. As discussed above, in one embodiment, the lenslets within such a monolithic array may have different focal lengths to produce the image slices at different distances. In other embodiments, the relay optical element may include a mixed array of lenses and mirrors, which may also be produced using diamond-turning techniques, for example. In certain embodiments, as discussed above, optical system 110 may be used to focus incoming light toward the relay optic 310, and may include any type of optical element configured to perform this function. In another example, the optical system 110 may include a pinhole aperture, rather than a reflecting and/or refracting optical element, such as a glass element. This may be advantageous in certain applications in that it may eliminate glint associated with most optical elements. In other examples, however, the relay optic may be used without additional foreoptics.

Thus, according to certain embodiments, sliced source imaging provides a mechanism by which to implement an imaging system having a tilted image plane and yet provides good image formation. As noted above with respect to FIG. 2B, in an imaging system with a tilted image plane, only those rays 220 that have the same incident and reflected angle, when measured with respect to the optical axis of the imaging system, are retro-reflected. All other reflected rays exit the system with a different ray angle (as shown, for example, in FIG. 2A), and with not be re-imaged back to the source, and therefore are not usable for optical augmentation. Accordingly, to eliminate this "residual" retro-reflection of rays 220 in a tilted image plane system, Fourier optical filtering may be implemented, specifically targeting the rays 220.

Figure 5A:
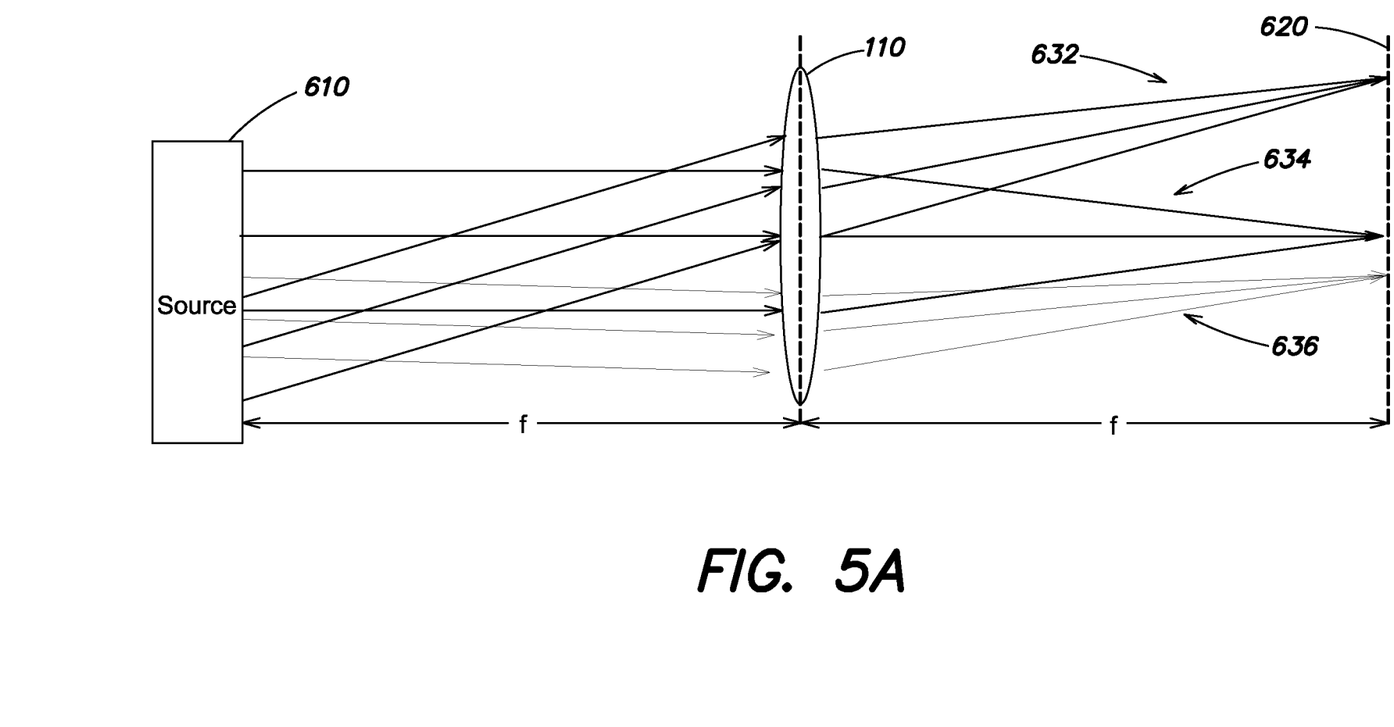
FIG. 5A is a diagram illustrating focus of incident light rays from a source onto the Fourier plane of the focusing optics.
Figure 5B:
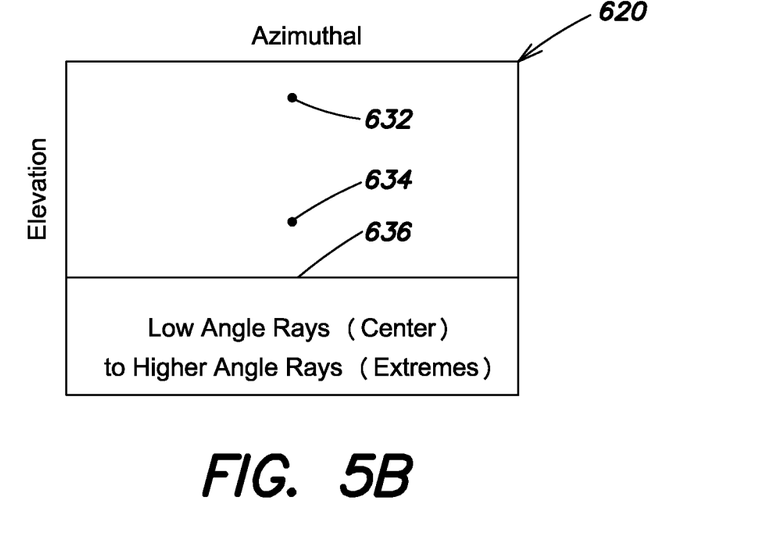
FIG. 5B is a representation of the optical Fourier plane corresponding to FIG. 5A and illustrates the location of the represented light rays impinging on the Fourier plane.

Referring to FIG. 5A, electromagnetic radiation from a source 610 is focused by the foreoptics 110 onto a Fourier plane 620 that is positioned a focal length (f) from the foreoptics 110. As shown in FIG. 5B, all rays of the same angle of incidence pass through the same point in the Fourier plane 620. For example, rays 632 overlap at a first point on the Fourier plane 620, rays 634 overlap at a second point, and rays 636 overlap at a third point, as illustrated. Rays with the same elevation angle, but different azimuth angles, form a line in the azimuth direction in the Fourier plane, as shown in FIG. 5B. Similarly, rays with the same azimuth angle, but different elevation angles would form line in the elevation direction in the Fourier plane. Thus, if the angle of incidence of rays that (absent any intervention) would be retro-reflected is known, these rays may be blocked in the Fourier plane. As discussed above, in an imaging system with a tilted image plane, only surface normal rays are retro-reflected. Therefore, since the tilt angle θ (410) is known and can be controlled, the angle of incidence of the rays that would be retro-reflected can be determined.

Figure 6:
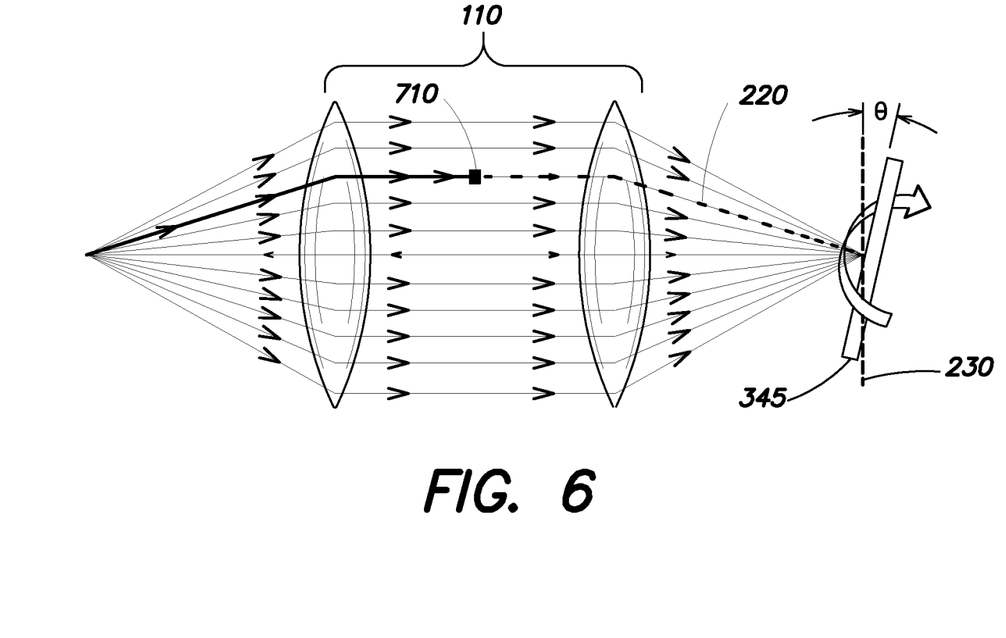
FIG. 6 is a diagram illustrating one example of Fourier optical filtering applied to eliminate angle-specific retro-reflection according to aspects of the invention.

Thus, referring to FIG. 6, to eliminate the otherwise retro-reflected rays 220, a Fourier filter may be used on the incoming light 120. According to one embodiment, this is achieved by locating a beam block 710 in the optical Fourier plane 620 that corresponds to where the retro-reflected rays 220 would be. The position of the beam block 710 on the Fourier plane may be determined based on the tilt angle θ of the imaging sensor 345 since this angle may be used to determine the angle at which those incoming rays 220 would need to enter the optical system 110 in order to be normally incident on image sensor 345. By blocking only the very narrow slice of rays with the critical angular component in the Fourier plane, elimination of retro-reflections may be ensured while maintaining a very high overall throughput and broad-bandwidth of the optical system.

In certain examples, the angle of rotation (or tilt angle) of the image plane relative to the optical axis may be fixed. Accordingly, the position of the beam block 710 in the Fourier plane may be fixed also. However, in other examples, the angle of rotation of the image plane may be dynamically changed, either from one use to another or during operation. Accordingly, the beam block may be correspondingly dynamically moved in the Fourier plane to block those retro-reflectable rays 220 corresponding to the new tilt angle of the image plane 340. The adjustment may be accomplished manually by an operator of the imaging system, or may be accomplished under control of a controller, such as a processor or other computing device.

Figure 7:
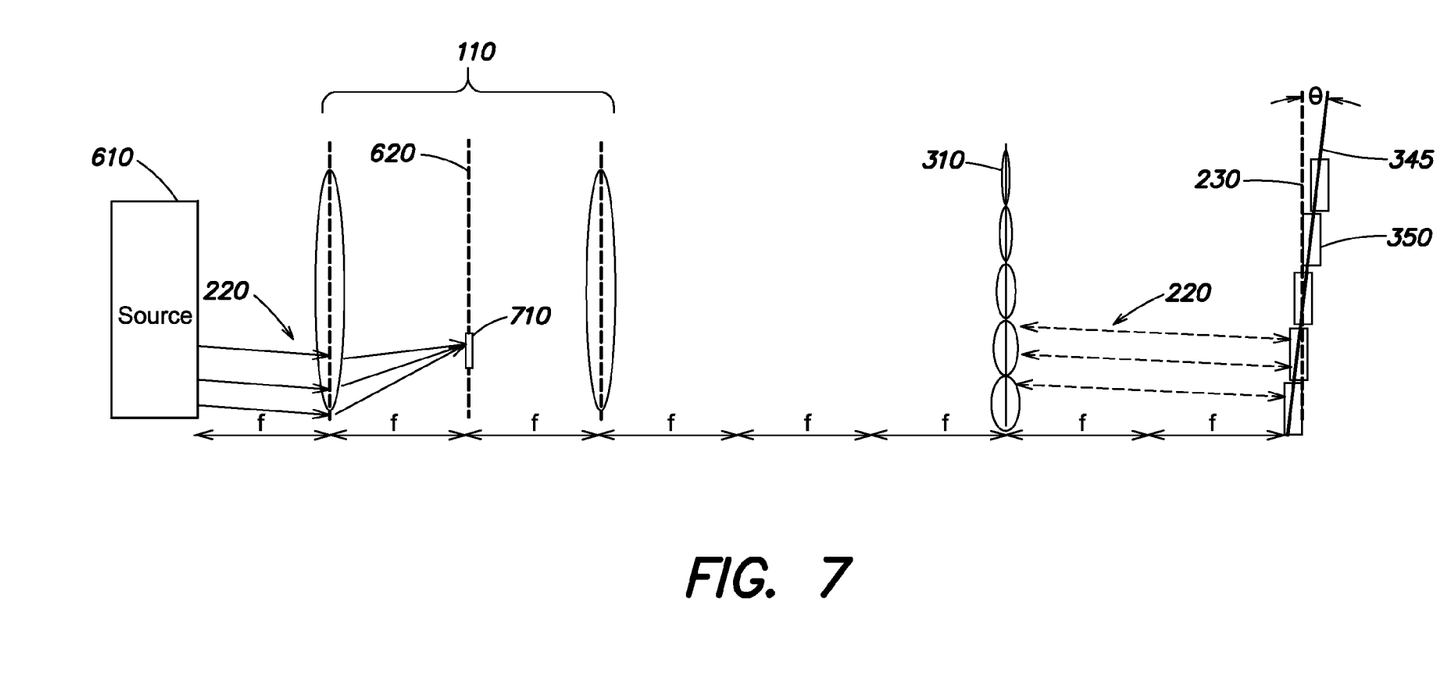
FIG. 7 is a diagram of one example of a non-retro-reflective optical imaging system using both sliced source imaging and Fourier optical filtering according to aspects of the invention.

FIG. 7 is a diagram illustrating one example of an imaging system using both sliced source imaging and angularly selective Fourier filtering to achieve a non-retro-reflective system. The source 610 produces the incoming light, including the rays 220. The imaging sensor 345 is positioned at the tilt angle θ with respect the normal 230 to the optical axis of the system. As discussed above, the segmented relay optic 310 is used to slice the image volume into a plurality of slices 350 that overlap the tilted image plane co-located with the tilted image sensor 345, thereby producing an in-focus image. The beam block 710 is positioned at the Fourier plane 620 to block those incoming rays 220 having an angular component that would otherwise cause these rays to be normally incident on the image sensor 345 and therefore be retro-reflected to the source 610. As discussed above, the known tilt angle, θ, of the image sensor 345 may be used to determine the appropriate height and position of the beam block 710 on the Fourier plane 620.

Since the beam block 710 can be used to block residual retro-reflective rays, the image sensor 345 may be tilted less than in a system where retro-reflection reduction is achieved through the tilting alone. According to one embodiment, the angle of rotation, θ, of the image sensor 345 may be kept relatively small, thereby allowing the use of a limited number of slices 350, for example, 3-5 slices, while maintaining an in-focus image. The beam block 710 is configured to block only those rays that would otherwise strike the image sensor 345 at normal incidence. Accordingly, using this combined approach of sliced source imaging and Fourier filtering, retro-reflection may be eliminated while allowing a maximum amount of light to be transmitted to the image sensor 345. This may be particularly beneficial in low f/# systems, as discussed above.

According to another embodiment, rather than simply being a passive blocking device, the beam block (or Fourier filter) 710 may include a non-retro-reflecting detector array. The detector array may be used to determine the azimuth angle of any otherwise retro-reflectable rays 220. This detector array may be non-retro-reflecting because it may be easily rotated to an angle exceeding the acceptance angle since this array need not be used for imaging. In order to determine the azimuth angle information, the detector array need only detect light, and need not produce an in-focus image. Accordingly, a high angular tilt that avoids retro-reflection may be easily accommodated. Additionally, the detector array may have a very small height such that it is unlikely that even a high angular tilt would exceed the depth of focus. Therefore, if necessary or desirable in certain examples, a substantially in-focus image may be obtained on this detector array even with a high angular tilt.

According to one embodiment, a spatial Fourier transform of a real object scene is imaged onto the Fourier plane 620. This spatial Fourier transformation maps all light rays into an Azimuth-Angle of Arrival (AOA) versus Elevation-AOA space in the Fourier plane, as illustrated in FIG. 5B. As discussed above, all rays arriving from elevation angles of the same value are mapped onto horizontal lines corresponding to their elevation AOA, as shown in FIG. 5B. Similarly, all rays arriving from azimuth angles of the same value are mapped onto vertical lines corresponding to their azimuth AOA. As discussed above, the only rays 220 that can retro-reflect are those that would arrive at the tilted image plane 340 at an incident angle that is near-normal to the surface of the imaging detector 345. This normal incident angle at the imaging detector 345 translates to a specific, unique, critical elevation AOA at the sensor aperture, measured relative to the optical axis of the system. The retro-reflectable elevation angle is fully determined solely by the tilt angle of the image plane which, in turn, is known from the system design, as discussed above. Thus, only rays 220 arriving within a narrow acceptance band of known elevation angles of arrival could retro-reflect; however, for those rays 220 within this elevation band, the full range of azimuthal angles are capable of retro-reflection.

Figure 5C:
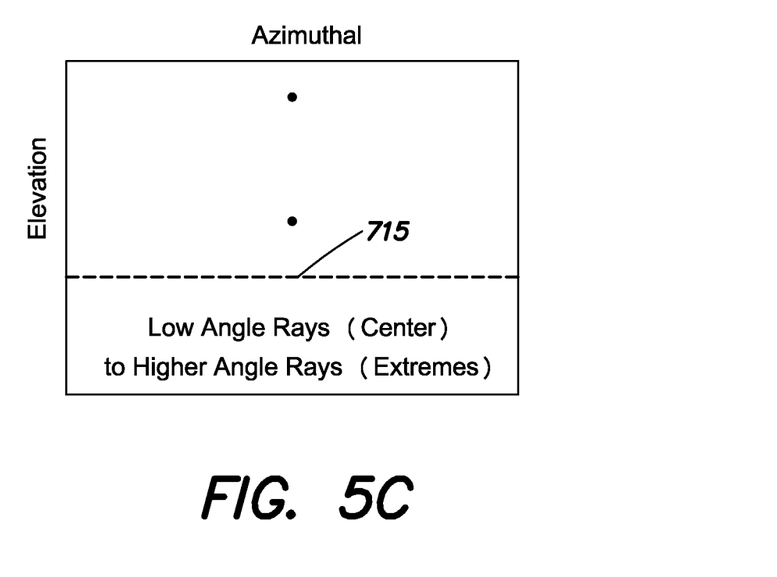
FIG. 5C is another diagram illustrating an example of the light rays impinging on a detector located on the Fourier plane.

Accordingly, in one embodiment the beam block 710 includes a linear array of detector elements 715 in the Fourier plane that lies along the horizontal line of locations that correspond to the retro-reflectable elevation angle, as illustrated in FIG. 5C. The location of each detector element 715 in the array corresponds to the azimuthal AOA of rays that impinge on the detector element. Thus each ray 220 that impinges on beam block 710 may be known in its elevation angle of arrival and its azimuthal AOA by the location of the detecting element 715 within the Fourier plane. The resolution with which the azimuth angle can be determined may depend, at least in part, on the size and number of detector elements 715 included in the beam block 710. This approach allows for the optical system to remain undetectable by retro-reflection, and also detects that there is an incoming probe or optical augmentation beam. This feature may be advantageous because a user can be alerted to active searching. Additionally, the angular location, relative to the imaging system, from which the active probe signal is emanating, is determined from the position of the beam block 710, as discussed above, which may also be very useful information for the user.

Thus, aspects and embodiments may provide optical imaging systems that allow for excellent image formation, while also being non-retro-reflective and providing several advantages. Through tilted image plane imaging combined with Fourier filtering, optical augmentation devices may be defeated, such that optical imaging systems according to various embodiments may be used for covert imaging. As discussed above, in certain embodiments, one or more relay optical elements, such as lens or mirror arrays, are used to tilt and segment the image plane, such that a clear image is formed while retro-reflection is substantially reduced, although other tilted image plane imaging techniques may be used. Furthermore, through the use of Fourier filtering, those rays of light that would otherwise provide a retro-reflection for optical augmentation devices (i.e., those normally incident on the image sensor) may be selected and blocked. Additionally, the blocked rays may be detected and used to determine the position (in terms of angle of elevation and azimuth relative to the imaging system) of an optical augmentation device that originated the blocked rays.

According to certain aspects, a combined approach of sliced sourced imaging and Fourier filtering may provide advantages over sliced source imaging alone or other tilted plane imaging configurations. As discussed above, an advantage is realized for a given f/# system where all reflected light is effectively blocked in order to ensure that specific retro-reflections (those rays useful for optical augmentation) are eliminated. By using angularly selective Fourier filtering in combination with sliced source imaging or other tilted plane imaging configurations, only the rays that would be retro-reflected are removed (e.g., blocked from reaching the image sensor by the beam block), while the remaining light is able to be transmitted without risk. As such, there may be minimal impact on the light throughput of the optical system. Another advantage may be realized across systems with different f/#'s, though may be particularly beneficial for fast lens systems. Specifically, as discussed above, selective filtering may reduce the number of slices required for a given f/#, thus decreasing the light loss and significantly reducing the system design complexity, particularly as the aperture size is increased.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A non-retro-reflective imaging system comprising:
   at least one optical element configured to receive electromagnetic radiation and to focus the electromagnetic radiation onto a tilted image plane having a surface normal that is tilted with an angle of rotation relative to an optical axis of the imaging system;
   an imaging sensor co-aligned with the tilted image plane and configured to produce an image from the electromagnetic radiation; and
   a filter configured to block rays of the electromagnetic radiation that would be normally incident on the imaging sensor from reaching the image sensor, a position of the filter in the imaging system being determined based on the angle of rotation.

2. The non-retro-reflective imaging system of claim 1, wherein the filter is positioned in a Fourier plane of the at least one optical element.

3. The non-retro-reflective imaging system of claim 2, further comprising:
   a controller configured to dynamically change the angle of rotation of the surface normal of the tilted image plane, and to correspondingly move the filter in the Fourier plane.

4. The non-retro-reflective imaging system of claim 2, wherein the filter includes a linear detector array including a plurality of detector elements.

5. The non-retro-reflective imaging system of claim 2, wherein the filter is a passive beam block.

6. The non-retro-reflective imaging system of claim 2, wherein the at least one optical element includes:
   a relay optic configured to receive the electromagnetic radiation representing a source image volume and to reimage the source image volume onto the tilted image plane; and
   foreoptics configured to receive and focus the electromagnetic radiation to provide the source image volume to the relay optic;
   wherein the filter is positioned in a Fourier plane of the foreoptics.

7. The non-retro-reflective imaging system of claim 6, wherein the relay optic is a structured relay optic configured to slice the source image volume into a plurality of image slices, and to reimage the plurality of image slices onto the tilted image plane and spatially position the plurality of image slices such that a depth of focus of each image slice overlaps the tilted image plane.

8. The non-retro-reflective imaging system of claim 7, wherein the structured relay optic includes one of an array of mirrors and an array of lenses.

9. The non-retro-reflective imaging system imaging system of claim 6, wherein the foreoptics includes at least one lens.

10. A method of non-retro-reflective imaging in an optical imaging system comprising:
    receiving electromagnetic radiation representing a source image;
    focusing the electromagnetic radiation onto a tilted image plane having a surface normal that is tilted with an angle of rotation relative to an optical axis of the optical imaging system;
    producing a substantially in-focus image at the tilted image plane using an imaging sensor co-aligned with the tilted image plane; and
    selectively filtering rays of the electromagnetic radiation that would be normally incident on the tilted image plane to prevent the rays from reaching the tilted image plane by positioning a Fourier filter at a location in a Fourier plane of the optical imaging system, the location being selected based on the angle of rotation.

11. The method of claim 10, wherein positioning the Fourier filter includes positioning a passive beam block at the location in the Fourier plane.

12. The method of claim 10, wherein the Fourier filter includes a linear detector array, and the method further comprising:
    detecting the rays of the electromagnetic radiation with the linear detector array.

13. The method of claim 12, wherein the linear detector array includes a plurality of detector elements, and the method further comprising:
    determining an azimuth angle of incidence of the rays of electromagnetic radiation based on detecting the rays with at least one of the plurality of detector elements.

14. The method of claim 10, further comprising dynamically varying the angle of rotation of the tilted image plane; and
    wherein selectively filtering the rays of the electromagnetic radiation includes correspondingly moving the Fourier filter in the Fourier plane to accommodate the varying angle of rotation.

15. The method of claim 10, further comprising:
    segmenting the source image into a plurality of image slices, each image slice having an image volume;
    individually reimaging the plurality of image slices onto the tilted image plane such that the image volume of each image slice overlaps the tilted image plane; and
    wherein producing the substantially in-focus image at the tilted image plane includes reconstructing the substantially in-focus image from the plurality of image slices.

16. The method of claim 15, wherein segmenting the source image and reimaging the plurality of image slices include:
    focusing the plurality of image slices onto the tilted image plane using an array of lenses, each lens having a different focal length.

17. The method of claim 15, wherein segmenting the source image and reimaging the plurality of image slices include:
    reflecting the plurality of image slices onto the tilted image plane using an array of mirrors.

18. A non-retro-reflective imaging system comprising:
    at least one optical element configured to receive electromagnetic radiation and to focus the electromagnetic radiation onto a tilted image plane having a surface normal that is tilted with a tilt angle relative to an optical axis of the imaging system;
    an imaging sensor co-aligned with the tilted image plane and configured to produce an in-focus image from the electromagnetic radiation; and
    a Fourier filter positioned in a Fourier plane of the at least one optical element and configured to block rays of the electromagnetic radiation that would be normally incident on the imaging sensor from reaching the image sensor, a position of the Fourier filter in the Fourier plane being determined by the tilt angle of the tilted image plane.

* * * * *